(12) United States Patent
Brandl et al.

(10) Patent No.: US 11,247,895 B2
(45) Date of Patent: Feb. 15, 2022

(54) SEGMENTED STRESS DECOUPLING VIA FRONTSIDE TRENCHING

(71) Applicant: Infineon Technologies AG, Neubiberg (DE)

(72) Inventors: Florian Brandl, Maxhütte-Haidhof (DE); Robert Gruenberger, Nandlstadt (DE); Wolfram Langheinrich, Dresden (DE)

(73) Assignee: Infineon Technologies AG

( * ) Notice: Subject to any disclaimer, the term of this patent is extended or adjusted under 35 U.S.C. 154(b) by 0 days.

(21) Appl. No.: 16/929,376

(22) Filed: Jul. 15, 2020

(65) Prior Publication Data

US 2020/0346922 A1    Nov. 5, 2020

Related U.S. Application Data

(63) Continuation of application No. 16/373,938, filed on Apr. 3, 2019, now Pat. No. 10,807,862.

(51) Int. Cl.
*H01L 41/053* (2006.01)
*B81B 7/00* (2006.01)

(52) U.S. Cl.
CPC ...... *B81B 7/0048* (2013.01); *B81B 2207/012* (2013.01); *B81B 2207/07* (2013.01)

(58) Field of Classification Search
None
See application file for complete search history.

(56) References Cited

U.S. PATENT DOCUMENTS

| | | | |
|---|---|---|---|
| 2015/0332956 A1* | 11/2015 | Bieselt | H01L 21/764 257/510 |
| 2017/0253477 A1* | 9/2017 | Baldo | B81B 3/0072 |

* cited by examiner

*Primary Examiner* — Benjamin P Sandvik
(74) *Attorney, Agent, or Firm* — Design IP

(57) ABSTRACT

A semiconductor device includes a first region; a second region that is peripheral to the first region; a substrate having a first surface and a second surface arranged opposite to the first surface; a stress-sensitive sensor disposed in the first region at the first surface of the substrate; a back end of line (BEOL) stack disposed on the first surface of the semiconductor chip that extends laterally from the MEMS element, in the first region, into the second region; a first cavity formed in the BEOL stack that exposes the sensitive area of the stress-sensitive sensor, wherein the first cavity extends entirely through the BEOL stack over the first region thereby exposing a sensitive area of the stress-sensitive sensor; and at least one stress-decoupling trench laterally spaced from the stress-sensitive sensor and laterally spaced from the first cavity with a portion of the BEOL stack interposed between.

17 Claims, 3 Drawing Sheets

Section A-A

SEGMENTED STRESS DECOUPLING VIA FRONTSIDE TRENCHING

CROSS-REFERENCE TO RELATED APPLICATIONS

This application is a continuation of U.S. patent application Ser. No. 16/373,938 filed Apr. 3, 2019, which is incorporated by reference as if fully set forth.

FIELD

The present disclosure relates generally to semiconductor devices and a method of manufacturing the same, and, more particularly, stress-sensitive sensors with a stress relief mechanism.

BACKGROUND

Microelectromechanical systems (MEMS) are microscopic devices, particularly those with moving parts. MEMS became practical once they could be fabricated using modified semiconductor device fabrication technologies, normally used to make electronics. Thus, a MEMS may be built into a substrate as a component of an integrated circuit, that is diced into a semiconductor chip that is subsequently mounted in a package.

Mechanical stress, including stress generated by a chip package, and external mechanical influences introduced to a package may inadvertently be transferred through the package to an integrated MEMS element, such as sensor, and, more particularly, to a pressure sensor. This transferred mechanical stress may affect the operation of the MEMS element or induce a shift (e.g., an offset) in a sensor signal that may lead to incorrect measurements.

For example, semiconductor pressure sensors have a pressure sensitive element arranged to measure an absolute pressure or a relative pressure (e.g. the difference between two pressures). A problem with many pressure sensors is that the sensor measures (or outputs, or gives) a signal, even in the absence of a pressure (or pressure difference) to be measured. This offset may be the result of mechanical stress and/or deformation of the housing (e.g., the packaging) of the sensor. The housing-stress/deformation will typically also cause a stress-component at the sensor surface where the sensitive elements (e.g., piezo-resistors) are located, and thereby cause an offset error, a linearity error, or even a hysteresis error to the output signal.

Therefore, an improved device capable of decoupling mechanical stress from an integrated MEMS element may be desirable.

SUMMARY

Embodiments provide semiconductor devices and a method of manufacturing the same, and, more particularly, stress-sensitive sensors with a stress relief mechanism.

One or more embodiments provide a semiconductor device that includes a semiconductor chip including a substrate having a first surface and a second surface arranged opposite to the first surface; a stress-sensitive sensor disposed at the first surface of the substrate, wherein the stress-sensitive sensor is sensitive to mechanical stress; a first pair of adjacent stress-decoupling trenches arranged laterally from a first lateral side of the stress-sensitive sensor, where each stress-decoupling trench of the first pair of adjacent stress-decoupling trenches extends partially from the first surface into the substrate towards the second surface although not completely to the second surface; and a first spring structure formed between the first pair of adjacent stress-decoupling trenches such that the first spring structure is arranged laterally from the stress-sensitive sensor and is configured to absorb external stress from an environment.

One or more further embodiments provide a semiconductor device that includes a semiconductor chip including a substrate having a first surface and a second surface arranged opposite to the first surface, where the first surface includes a plurality of sensor areas laterally separated from each other, where the plurality of sensor areas include a first pair of adjacent sensor areas; a plurality of stress-sensitive sensors disposed in the plurality of sensor areas at the first surface of the substrate, where each sensor area includes at least one of the a plurality of stress-sensitive sensors, and where each stress-sensitive sensor comprises a sensitive area configured to detect stress; a first plurality of stress-decoupling trenches arranged between the first pair of adjacent sensor areas, where the first plurality of stress-decoupling trenches extend from the first surface partially into the substrate towards the second surface although not completely to the second surface; and a first spring structure formed between a first pair of adjacent stress-decoupling trenches of the first plurality of stress-decoupling trenches such that the first spring structure is arranged laterally between the first pair of adjacent sensor areas and is configured to absorb external stress from an environment.

BRIEF DESCRIPTION OF THE DRAWINGS

Embodiments are described herein making reference to the appended drawings.

DETAILED DESCRIPTION

Figure 1:
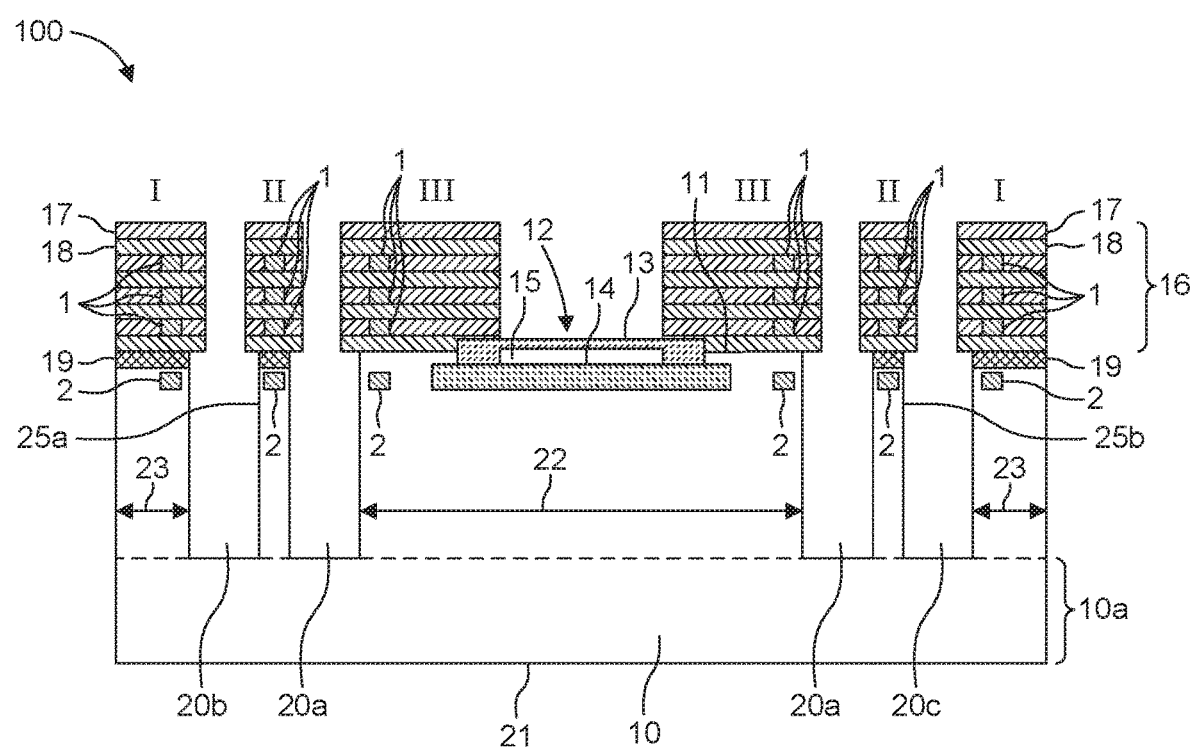
FIG. 1 shows a cross-sectional diagram of a chip 100 (e.g., a sensor chip) according to one or more embodiments.

In the following, various embodiments will be described in detail referring to the attached drawings, where like reference numerals refer to like elements throughout. It should be noted that these embodiments serve illustrative purposes only and are not to be construed as limiting. For example, while embodiments may be described as comprising a plurality of features or elements, this is not to be construed as indicating that all these features or elements are needed for implementing embodiments. Instead, in other embodiments, some of the features or elements may be omitted, or may be replaced by alternative features or elements. Additionally, further features or elements in addition to the ones explicitly shown and described may be provided, for example conventional components of sensor devices.

Features from different embodiments may be combined to form further embodiments, unless specifically noted otherwise. Variations or modifications described with respect to one of the embodiments may also be applicable to other embodiments. In some instances, well-known structures and devices are shown in block diagram form rather than in detail in order to avoid obscuring the embodiments.

Connections or couplings between elements shown in the drawings or described herein may be wire-based connections or wireless connections unless noted otherwise. Furthermore, such connections or couplings may be direct connections or couplings without additional intervening elements or indirect connections or couplings with one or more additional intervening elements, as long as the general purpose of the connection or coupling, for example to transmit a certain kind of signal or to transmit a certain kind of information, is essentially maintained.

One or more embodiments relate to stress-sensitive sensors integrated in a semiconductor chip and subsequently mounted to a package. Stress-sensitive sensors include microelectromechanical systems (MEMS) stress sensors, including MEMS pressure sensors. The MEMS may be referred to as a MEMS element or MEMS device, and may include, for example, capacitive MEMS sensor devices or piezo-resistive MEMS sensor devices.

The package may be adapted to enable a MEMS pressure sensor to detect and/or measure a force imposed thereon. For example, the MEMS pressure sensor may operate as a transducer that generates an electrical signal as a function of the pressure imposed, and the package may have an opening formed in proximity to the MEMS pressure sensor that allows a medium to interact with the MEMS pressure sensor. The medium may be any pressure measurable or pressure inducing entity.

In general, a sensor, as used herein, may refer to a component which converts a physical quantity to be measured to an electric signal, for example a current signal or a voltage signal. The physical quantity may for example comprise a magnetic field, an electric field, a pressure, a force, a temperature, a current, or a voltage, but is not limited thereto. A sensor device, as described herein, may be a voltage sensor, a current sensor, a temperature sensor, a magnetic sensor, and the like. The physical quantity may, for example, be pressure as an expression of force imposed on a sensitive area or region of the sensor Thus, the sensor may directly measure and/or detect stress, and generate a sensor signal based on the detected stress.

Alternatively, the sensor may generate a sensor signal based on some other physical quantity (e.g., a Hall sensor sensitive to a magnetic field). In this case. mechanical stress transferred to the sensor may adversely affect the sensor signal (e.g., based on a purely parasitic effect). Thus, the sensor could be said to have indirectly measured and/or detected stress.

Thus, a stress-sensitive sensor is any sensor that is sensitive to mechanical stress, either directly or indirectly, in a way that impacts the sensor signal. Stress sensitive sensors include both MEMS sensors and non-MEMS sensors. While some examples are directed to MEMS sensors for the stress-sensitive sensor, it will be appreciated that MEMS sensors and non-MEMS sensors may be regarded as interchangeable.

Debris, such as foreign particles, may negatively impact the performance of any sensor. Thus, it may be desirable to prevent debris from reaching the surface of the sensor, and, specifically, from reaching the sensitive area or region of the sensor.

A manufacturing process for semiconductor chip fabrication may include two sequential sub-processes commonly referred to as front-end and back-end production. The back-end production may further include two sequential sub-processes commonly referred to as pre-assembly and assembly.

Front-end production refers primarily to wafer fabrication. A wafer, as used herein, may also be referred to as a substrate. The front-end production may start with a clean disc-shaped silicon wafer that will ultimately become many silicon chips. First, a photomask that defines the circuit patterns for circuit elements (e.g., transistors) and interconnect layers may be created. This mask may then be laid on the clean silicon wafer and is used to map the circuit design. Transistors and other circuit elements may then be formed on the wafer through photolithography. Photolithography involves a series of steps in which a photosensitive material is deposited on the wafer and exposed to light through a patterned mask; unwanted exposed material is then etched away, leaving only the desired circuit pattern on the wafer. By stacking the various patterns, individual elements of the semiconductor chip may be defined. A stress-sensitive sensor, which may be a MEMS device or a MEMS element, may also be incorporated onto and/or into the surface of the wafer and connected to one or more circuit elements. During the final phase of the front-end production process, each individual chip on the wafer is electrically tested to identify properly functioning chips for assembly.

Back-end production refers to the assembly and test of individual semiconductor devices or chips. The assembly process is intended to protect the chip, facilitate its integration into electronic systems, limit electrical interference and enable the dissipation of heat from the device. Once the front-end production process is complete, the wafer is sawed or diced into individual semiconductor chips. This dicing of the wafer into individual semiconductor chips is referred to as pre-assembly.

In an assembly phase of the back-end production, the semiconductor chips are incorporated into a package. For example, these semiconductor chips may be individually attached by means of an alloy or an adhesive to a lead frame, a metallic device used to connect the semiconductor to a circuit board. Leads on the lead frame may then be connected by aluminum or gold wires to the input/output terminals on the semiconductor chip through the use of automated machines known as wire bonders. Each semiconductor device may then be at least partially encapsulated in a plastic molding compound or a ceramic case, forming the package.

Thus, a MEMS element or other stress-sensitive sensor may be built into a substrate as a component of an integrated circuit, the substrate then being diced into semiconductor chips that are each subsequently mounted in a package.

It will be appreciated that while the pre-assembly (i.e., dicing) process may be described as part of the back-end production flow, the chips may be partially singulated during final phase of the front-end production. Thus, in some instances, pre-assembly may begin or may be performed during the front-end production.

According to one or more embodiments, mechanical stress-decoupling is provided to a stress-sensitive sensor as a stress relief mechanism. A stress-decoupling feature such as one or more trenches (i.e., one or more stress-decoupling trenches) may be provided. In additional, each stress-decoupling trench may be filled with a gel (e.g., a silicone gel) and the gel may additionally be deposited over the stress-sensitive sensor at the wafer level (i.e., during the front-end production process), or during or subsequent to the pre-assembly process, including prior to or subsequent to packaging. The protective material may be deposited on an exposed surface of the stress-sensitive sensor such that an entire exposed surface of the stress-sensitive sensor is covered by the protective material.

The exposed surface of the stress sensitive sensor may include or may be referred to as a sensitive area that enables the stress sensitive sensor to measure a physical quantity. For example, the stress sensitive sensor may be a MEMS pressure sensor that is configured to detect or measure a change in pressure in response to a change of force imposed on the exposed surface. The protective material is configured such that, when the stress sensitive sensor is covered by the protective material, a sensor functionality of the stress sensitive sensor remains intact. For example, the protective material may be a silicone gel that has an elastic modulus and/or a Poisson's ratio that permits a force exerted thereon to be transferred to the MEMS pressure sensor. Thus, the protective material is flexible enough that when the protective material is depressed, the sensitive area of the MEMS pressure sensor is also depressed proportionally.

More particularly, the protective material permits full sensor functionality of the stress-sensitive sensor, including mechanical functionality and electrical functionality, while sealing an entire surface of the stress-sensitive sensor. Even more particularly, the protective material is configured such that no functionality of the stress-sensitive sensor is impeded by the protective material.

By ensuring that the functionality of the stress-sensitive sensor remains intact, the protective material may be deposited onto the stress-sensitive sensor as a permanent material at an early stage of the chip fabrication process. Thus, the stress-sensitive sensor may already be configured in an operable state (e.g., a final operable state) at the time the protective material is deposited onto the stress-sensitive sensor, and the protective material may remain completely intact after deposition, including throughout the assembly process, such that it remains a feature in the final product.

As a result of the early deposition of the protective material, the stress-sensitive sensor is provided early particle and humidity protection from foreign matter that may have been introduced during (pre-)assembly processes that could influence the sensor performance.

While some embodiments provided herein may refer to the protective material as being a temperature hardening gel (e.g., silicone gel), others may use a ultraviolet (UV) hardening gel. However, the protective material is not limited thereto, and may be any material that provides protection from foreign matter while permitting sensor functionality of the stress-sensitive sensor, and more particularly permits sensor functionality of the stress-sensitive sensor at the time of deposition of the protective material. Thus, the protective material may be any protective gel.

FIG. 1 shows a cross-sectional diagram of a chip 100 (e.g., a sensor chip) according to one or more embodiments. The chip 100 includes a semiconductor substrate 10 (e.g., a silicon substrate) having a first main surface 11 at the frontside of the chip 100 and a second main surface 21 at the backside of the chip 10, opposite to the frontside. The chip further includes a MEMS element 12 integrated at the main surface 11.

The MEMS element 12 may be a capacitive MEMS element that includes two parallel conductive plates: a top electrode 13 and a bottom electrode 14, separated by a dielectric material 15. For example, the dielectric material 15 may be a vacuum where a cavity is formed between the top electrode 13 and the bottom electrode 14. The vacuum serves as a reference pressure for the pressure sensor. A dielectric layer (not illustrated) may also be disposed between the electrodes 13 and 14 (e.g., on the upper surface of the bottom electrode 14).

The electrodes 13 and 14 form a capacitive element having a baseline or reference capacitance when no pressure is applied to the MEMS element 12. The top electrode 13 is flexible and pressure sensitive, whereas the bottom electrode is rigid and fixed being located on the rigid substrate 10 beneath and/or around it. The top electrode 13 may be a sensitive diaphragm or membrane and the cavity is formed between the fixed, bottom electrode 14 and the movable electrode 13 to allow deflection of the diaphragm or membrane. When pressure is applied onto the sensitive diaphragm, the cavity enclosed between the two parallel electrodes 13 and 14 reduces in volume as the sensitive diaphragm deflects and approaches the stationary one, resulting in a detectable change in the capacitance between the electrodes 13 and 14 corresponding to the applied pressure. The change in capacitance is a readable value through an electrical signal.

Alternatively, the MEMS element 12 may be another type of integrated pressure sensor or another type of stress-sensitive sensor. Accordingly, each MEMS element 12 may occupy a MEMS area of the substrate 10 and includes at least one sensitive area that is sensitive to and may be operable to detect stress. In general, a MEMS area may be referred to as a sensor area or a stress-sensitive area of the substrate 10 at which a stress-sensitive sensor is integrated at the substrate 10.

The chip 100 further includes a back end of line (BEOL) stack 16 that includes multiple (alternating) dielectric layers 17 and metal layers 18. The BEOL is the second portion of IC fabrication where the individual devices (transistors, capacitors, resistors, etc.) get interconnected with wiring on the wafer, i.e., the metallization layer.

The metal layers 18 may include metal lines 1 used to electrically connect sensor circuits (e.g., in region I) with a sensor (e.g., MEMS element 12 in region III) via spring structures 25 (e.g., in region II). Additionally, or alternatively, electrical connections can be made between the different regions I, II, and III via implant regions 2 in the semiconductor substrate 10. Thus, regions I, II, and III are interconnected via conductive structures that are configured to carry an electrical signal.

It will be appreciated that, while perhaps not shown, embodiments illustrated in other figures may also include a BEOL stack 16 with metal lines 1 and/or implant regions 2 for making electrical connections between the three regions I, II, and III. Thus, the devices shown in FIGS. 2A, 2B, 3, and 4 also include one or more of these conductive structures.

The chip 100 further includes a shallow trench isolation (STI) region 19 which is an integrated circuit feature which prevents electric current leakage between adjacent semiconductor device components.

The chip 100 further includes a stress-decoupling feature made of one or more stress-decoupling trenches 20a, 20b, and 20c, collectively referred to as stress-decoupling trenches 20. Each stress-decoupling trench 20 is laterally spaced from the MEMS element 12, extends from the main surface 11 of the substrate 10 into the substrate 10, and extends partially through the substrate 10. In other words, the trenches 20 do not extend completely through the substrate 10. Thus, the trenches 20 end in silicon on a single wafer that includes the entire MEMS element 12.

The trenches 20 define a vertical boundary between an inner or a first region 22 of the chip 100, where the MEMS element 12 is provided, and one or more peripheral or second regions 23 of the chip 100. The trenches 20 are configured to decouple any mechanical stress coming from, for example, the package of the chip 100 from being transferred the MEMS element 12. That is, the trenches 20 are configured to reduce any mechanical stress present in the peripheral region 23 of the chip 100 from being transferred to the inner region 22 of the chip 100, and ultimately to the MEMS element 12. Thus, the stress-decoupling feature shields the MEMS element 12 from external mechanical influences and thereby prevents a shift in a sensor signal produced by the MEMS element 12 or stress-sensitive sensor due these influences.

In order to form the trenches 20, respective openings in the BEOL stack 16 may be formed by using a membrane release and trench hard mask. Deep trench etching is then used to form trenches 20 that extend from the main surface 11 (i.e., from the frontside of the chip) into the substrate 10 towards the main surface 21 (i.e., towards the backside of the chip). As noted above, each trench 20 extends partially, but not completely through the substrate 10. For example, the trenches 20 may have a depth of approximately 325-375 µm. In particular, the depth of the trenches 20 is in the order of a distance between adjacent trenches that envelop the MEMS element 12 or deeper.

As such, the trenching of the substrate 10 is exclusive to frontside trenching, without backside trenching or backside cavities being formed. In this way, the main surface 21 at the backside of the chip 100 is a planar, single-member surface that is unbroken. Furthermore, the substrate 10 includes a backside portion 10a that laterally extends throughout a body of the substrate 10 (i.e., throughout the entire chip) that is free from trenches, cavities, and the like. This backside portion 10a extends from the main surface 21 at the backside of the chip 10 to the bottom of the deepest trench 20.

As a result of the backside portion 10a, the substrate 10 is a one-piece integral member whose unitary construction is maintained throughout the entirety of the chip. In other words, two or more substrates are not used, nor is a single substrate broken into multiple parts by trenches or cavities. The inner region 22 of the substrate 10 at which the MEMS element 12 is arranged extends vertically from the main surface 11 and is integrally formed with the backside portion 10a.

One or more of the trenches may envelope the MEMS element 12. For example, trench 20a may be a single, continuous trench that encircles the MEMS element 12. Similarly, trenches 20b and 20c, each adjacent to trench 20a, may together form a single, continuous trench that encircles the MEMS element 12.

Alternatively, trench 20b may envelop a different MEMS element (not illustrated) that is laterally disposed from MEMS element 12 in a different MEMS area of the chip 100. Similarly, trench 20c may envelop a further different MEMS element (not illustrated) that is laterally disposed from MEMS element 12 in a further different MEMS area of the chip 100. Thus, the chip 100 may include one or more different MEMS areas, each of which includes a different MEMS element 12 integrated with the substrate 10, where each MEMS element 12 includes one or more sensitive areas operable for detecting pressure and/or stress.

Additionally, or alternatively, one or both trenches 20b and 20c may extend from first lateral side of the substrate 10 to a second lateral side of the substrate 10 that is opposite to the first lateral side.

In addition, a spring structure 25 (e.g., spring structure 25a or 25b) is formed between two adjacent trench segments and is configured to absorb external stress from the environment such that the amount of the external stress transferred to the inner region 22 (i.e., to the MEMS element 12) is reduced or prevented. The external stress may be caused by the package itself (e.g., due to thermal mismatch). Two trenches or trench segments that are adjacently arranged on a same lateral side of the MEMS element 12 so as to form a spring structure 25 therebetween may be referred to as "adjacent" or "neighboring" trenches. Thus, a spring structure 25 is formed between a pair of adjacent trenches 20.

A spring structure 25 is defined as a portion of the substrate 10, arranged between two adjacent trenches 20 or between two laterally separated portions of a same trench 20, that extends from an upper portion of the backside portion 10a towards the first main surface 11 at the frontside of the chip 100. In other words, a spring structure 25 forms the sidewalls of two adjacent trenches 20 or adjacent trench segments. In some embodiments, a spring structure 25 may extend to the first main surface 11 at the frontside of the chip 100. The two adjacent trenches 20 or the two laterally spaced portions of a same trench 20 extend parallel to each other such that the spring structure 25 is formed therebetween.

In this example, a spring structure 25a is formed between trenches 20a and 20b and a spring structure 25b is formed between trenches 20a and 20c. Spring structures 25a and 25b may separate members or may be a single member of unitary construction, for example, if trenches 20b and 20c form a single trench that is concentric to trench 20a.

Furthermore, each spring structure 25 may be electrically coupled to a respective MEMS element 12, for example, via metal lines 1 and/or dopant regions 2, and configured to receive a sensor signal (e.g., an electrical signal) generated by at least one sensitive area of the respective MEMS element 12 and provide an electrical path to a sensor circuit that is configured to read out the sensor signal.

All spring structures 25 of the chip are conjoined by the backside portion 10a of the substrate 10, which is of a one-piece integral construction.

Figure 2A:
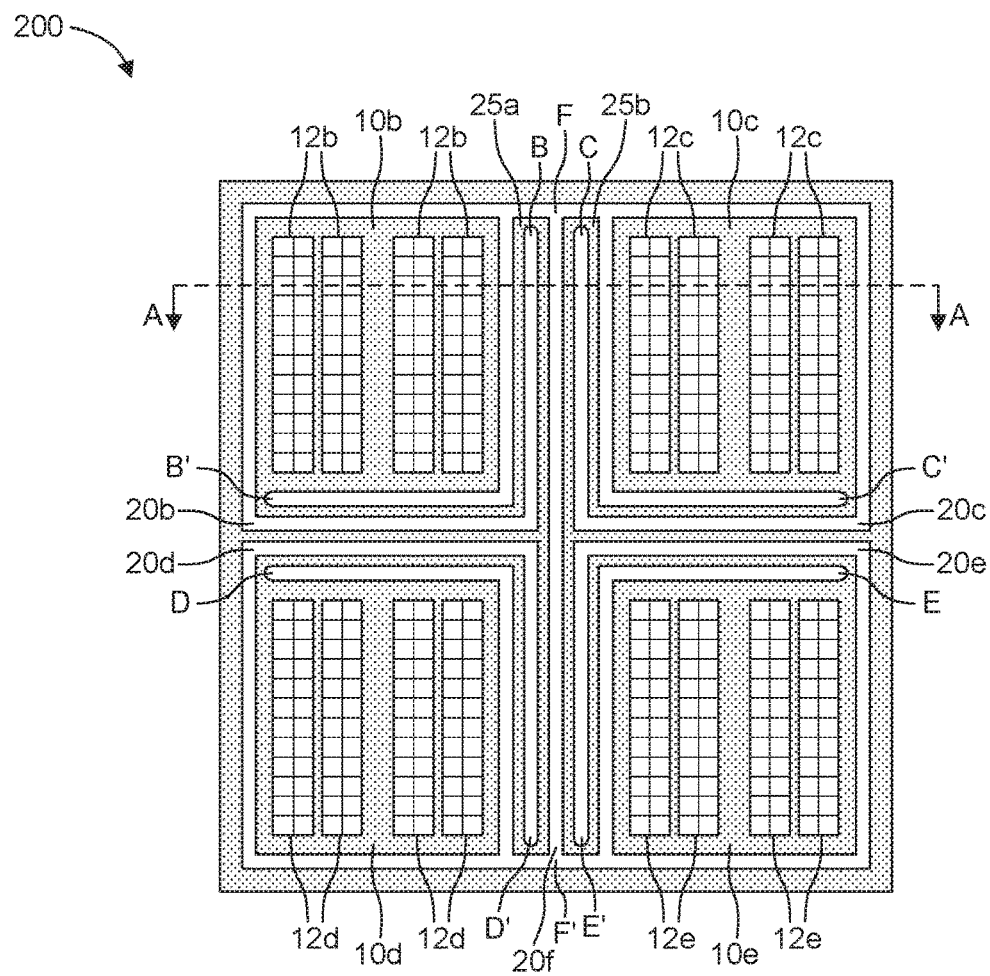
FIG. 2A shows a top-view diagram of a chip according to one or more embodiments.
Figure 2B:
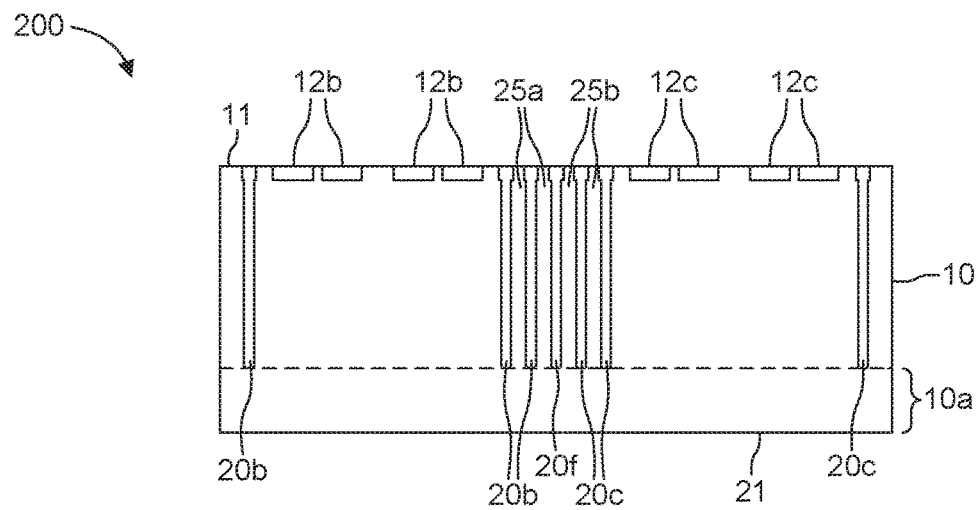
FIG. 2B shows a cross-sectional diagram of the chip taken along line A-A shown in FIG. 2A.

FIG. 2A shows a top-view diagram of a chip 200 according to one or more embodiments. Additionally, FIG. 2B shows a cross-sectional diagram of chip 200 taken along line A-A shown in FIG. 2A. In particular, the substrate 10 includes four MEMS areas 10b, 10c, 10d, and 10e at which different MEMS elements area integrated at the first main surface 11. In this example, each MEMS element includes four sensitive areas laterally separated from each other and arranged in a grid formation. Each sensitive area is configured to generate an electrical signal in response to a detected pressure and/or stress. The electrical signals generated by the sensitive areas of a MEMS element may be added or averaged together by the sensor circuit.

As can be seen in FIG. 2A, MEMS area 10b includes a MEMS element that includes sensitive areas 12b, MEMS area 10c includes a MEMS element that includes sensitive areas 12c, MEMS area 10d includes a MEMS element that includes sensitive areas 12d, and MEMS area 10e includes a MEMS element that includes sensitive areas 12e. Each MEMS area may have a rectangular shape.

In addition, a plurality of trenches 20 are formed between adjacent or neighboring MEMS areas 10b-10e. Moreover, a trench 20 or a segment of a trench 20 is also formed around a peripheral region of the MEMS areas 10b-10e, between the MEMS area and the lateral edges of the chip 200. Furthermore, one or more trenches 20 may be conjoined to form a single, continuous trench.

Spring structures 25 (e.g., spring structures 25a and 25b) are formed between two adjacent trenches 20 or between two laterally separated portions of a same trench 20.

The plurality of trenches 20 includes trench 20b that encircles MEMS area 10b. In particular, trench 20b includes a first end B and a second end B'. Thus, in this example, trench 20b wraps around the MEMS area 10b 1.5 times such that one trench segment is formed by trench 20b at the outer peripheral edges (i.e., those edges neighboring an edge of the chip 200) of the MEMS area and two trench segments are formed by trench 20b at the inner peripheral edges (i.e., those edges not neighboring an edge of the chip 200, or rather those edges that are most proximate to adjacent MEMS areas 10c and 10d).

As a result, a pair of adjacent stress-decoupling trenches or trench segments are formed from one lateral side of the MEMS area 10b by a single, continuous trench 20b that encircles the MEMS area 10b such that at least a portion of the single, continuous trench overlaps with itself in a lateral direction. Such an arrangement may occur when the single, continuous trench 20b has a spiral pattern that winds around the MEMS area 10b, with a spring structure 25 formed between laterally overlapping segments of the trench 20b. It naturally follows that the spring structure 25 may also have a spiral pattern that is congruent with the spiral pattern of the single, continuous trench 20b.

Similar to trench 20b, trench 20c includes a first end C and a second end C'. Thus, in this example, trench 20c wraps around the MEMS area 10c 1.5 times such that one trench segment is formed by trench 20c at the outer peripheral edges (i.e., those edges neighboring an edge of the chip 200) of the MEMS area and two trench segments are formed by trench 20c at the inner peripheral edges (i.e., those edges not neighboring an edge of the chip 200, or rather those edges that are most proximate to adjacent MEMS areas 10b and 10e).

Similar to trench 20b, trench 20d includes a first end D and a second end D'. Thus, in this example, trench 20d wraps around the MEMS area 10d 1.5 times such that one trench segment is formed by trench 20d at the outer peripheral edges (i.e., those edges neighboring an edge of the chip 200) of the MEMS area and two trench segments are formed by trench 20d at the inner peripheral edges (i.e., those edges not neighboring an edge of the chip 200, or rather those edges that are most proximate to adjacent MEMS areas 10b and 10e).

Similar to trench 20b, trench 20e includes a first end E and a second end E'. Thus, in this example, trench 20e wraps around the MEMS area 10e 1.5 times such that one trench segment is formed by trench 20e at the outer peripheral edges (i.e., those edges neighboring an edge of the chip 200) of the MEMS area and two trench segments are formed by trench 20e at the inner peripheral edges (i.e., those edges not neighboring an edge of the chip 200, or rather those edges that are most proximate to adjacent MEMS areas 10c and 10d).

Trench 20f includes a first end F and a second end F' such that the trench 20f extends laterally from one edge of the chip 200 to a second edge of the chip 200 that is opposite to the first edge of the chip. Trench 20f may also be formed to unite with trenches 20b-20d, forming a single, continuous trench.

As such, five trenches 20 are formed laterally between MEMS areas 10b and 10c, with four spring structures 25 formed laterally therebetween. In this case, there are five pairs of adjacent trenches arranged laterally between MEMS areas 10b and 10c, which results in the four spring structures 25 (i.e., each pair has a corresponding spring structure 25 arranged therebetween).

In addition, five trenches 20 are formed laterally between MEMS areas 10d and 10e, with four spring structures 25 formed laterally therebetween; four trenches 20 are formed laterally between MEMS areas 10b and 10d, with three spring structures 25 formed laterally therebetween; and four trenches 20 are formed laterally between MEMS areas 10c and 10e, with three spring structures 25 formed laterally therebetween. The spring structures 25 are configured to absorb external stress from the environment such that each MEMS area 10b-10e, and thus each sensitive area of the MEMS elements, is insulated from the external stress.

Figure 3:
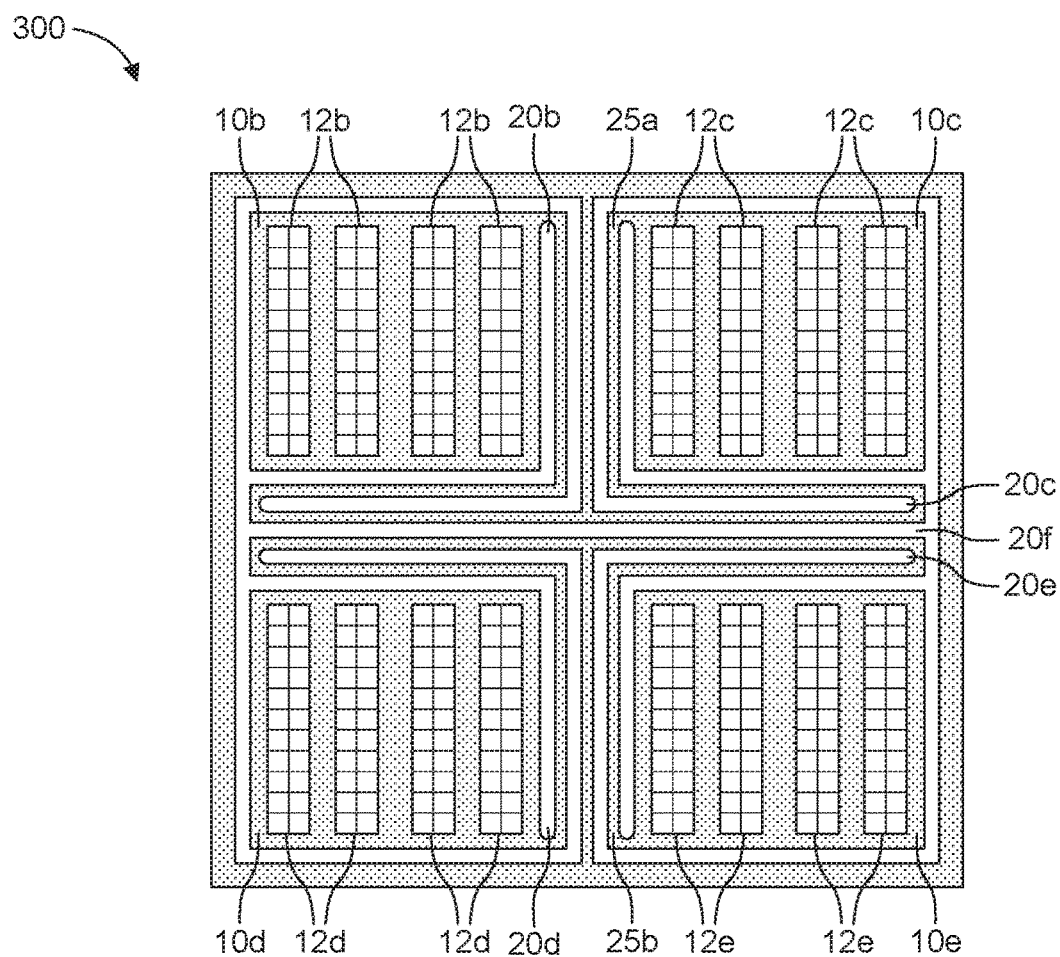
FIG. 3 shows a top-view diagram of a chip according to one or more embodiments.

FIG. 3 shows a top-view diagram of a chip 300 according to one or more embodiments. Chip 300 is similar to chip 200 shown in FIGS. 2A and 2B, with the exception that chip 300 has a different pattern of trenches 20 (i.e., trenches 20b-20f) and spring structures 25 (i.e., spring structures 25a and 25b).

Figure 4:
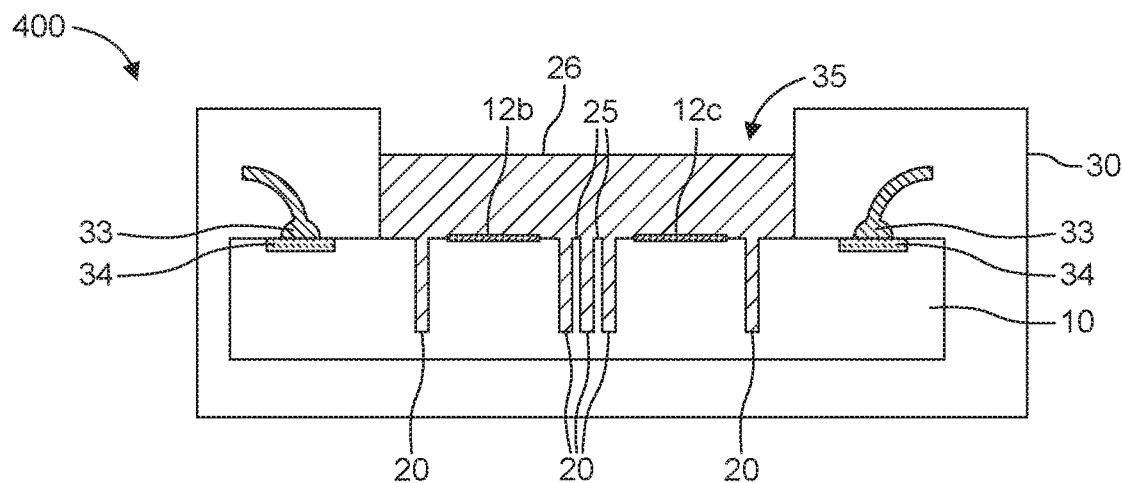
FIG. 4 shows a cross-sectional diagram of a chip package according to one or more embodiments.

FIG. 4 shows a cross-sectional diagram of a chip package 400 according to one or more embodiments. In particular, the chip package 400 is a molded package that houses a chip (e.g., chip 200) in a molded compound 30.

Bond wires 33 are used to attach respective die pads 34 of the chip 200 to a leadframe (not illustrated).

From a process point of view, the chip 200 may be attached to the leadframe by an attach layer and the bond wires 33 may be coupled to the leadframe and the die pads 34. Then, the chip 200 and the bond wires 33 may be molded in the molded compound 30. A protective material 26 may then be dispensed into the trenches 20 and over the MEMS elements 12 (e.g., over the MEMS areas 12b-12e), at least partially filling the cavity 35 formed by sidewalls of the molded compound 30. In particular, the cavity 35 is provided over the MEMS elements 12b and 12c (and MEMS elements 12d and 12e) such that an exerted pressure can be applied to the sensitive areas of each of the MEMS elements through the protective material 26. The protective material 26 may fully extend laterally between the sidewalls of the molded compound 30. Finally, the protective material 26 may be cured.

The spring structures 25 are configured to absorb external stress from the environment such that each MEMS area 10b-10e, and thus each sensitive area of the MEMS elements, is insulated from the external stress.

In view of the above, the aforementioned embodiments provide mechanical decoupling from environmental stress to MEMS elements, in particular integrated pressure sensors or other stress-sensitive sensors, by decoupling the MEMS elements from the package and provide a mechanically robust and easy-to-handle solution. In addition, screening efficiency may be improved by tightening of an intrinsic distribution (p-sens, p0, . . . ).

Although embodiments described herein relate to MEMS pressure sensors, and, in some cases capacitive pressure sensors, it is to be understood that other implementations may include other types of stress-sensitive sensors or other types of MEMS devices or MEMS elements. In addition, although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the method steps may be executed by such an apparatus.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Furthermore, the description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid in the understanding of the principles of the disclosure and the concepts contributed to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof. Thus, it is understood that modifications and variations of the arrangements and the details described herein will be apparent to others skilled in the art.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

What is claimed is:

1. A semiconductor chip, comprising:
a first region;
a second region that is peripheral to the first region;
a substrate having a first surface and a second surface arranged opposite to the first surface;
a stress-sensitive sensor disposed in the first region at the first surface of the substrate, wherein the stress-sensitive sensor includes a sensitive area that is sensitive to mechanical stress;
a back end of line (BEOL) stack disposed on the first surface of the semiconductor chip that extends laterally from the MEMS element, in the first region of the semiconductor chip, into the second region of the semiconductor chip;
a first cavity formed in the BEOL stack that exposes the sensitive area of the stress-sensitive sensor, wherein the first cavity extends entirely through the BEOL stack over the first region thereby exposing the sensitive area of the stress-sensitive sensor; and
at least one stress-decoupling trench laterally spaced from the stress-sensitive sensor and laterally spaced from the first cavity with a portion of the BEOL stack interposed between the at least one stress-decoupling trench and the first cavity, wherein the at least one stress-decoupling trench extends through the BEOL stack and through the first surface into the substrate, wherein the at least one stress-decoupling trench extends partially into the substrate towards the second surface although not completely to the second surface, and wherein the at least one stress-decoupling trench defines a vertical boundary between the first region of the semiconductor chip and the second region of the semiconductor chip,
wherein the at least one stress-decoupling trench includes a first pair of adjacent stress-decoupling trenches arranged laterally from a first lateral side of the stress-sensitive sensor,
wherein the semiconductor chip further comprises a first spring structure formed between the first pair of adjacent stress-decoupling trenches such that the first spring structure is arranged laterally from the stress-sensitive sensor and is configured to absorb external stress from an environment, and
wherein the BEOL stack is disposed on the first spring structure.

2. The semiconductor chip of claim 1, wherein the BEOL stack includes a first portion arranged in the first region and which includes at least one first conductive structure, a second portion arranged in the second region and which includes at least one second conductive structure, and a third portion arranged on the first spring structure and which includes at least one third conductive structure that is electrically connected to and between the at least one first conductive structure and the at least one second conductive structure.

3. The semiconductor chip of claim 2, wherein the third portion of the BEOL stack is arranged laterally between the first portion and the second portion of the BEOL stack.

4. The semiconductor chip of claim 2, wherein the at least one first conductive structure is electrically coupled to the stress-sensitive sensor and the at least one second conductive structure is electrically coupled to a sensor circuit integrated in the substrate at the second region of the semiconductor chip.

5. The semiconductor device of claim 1, wherein the substrate includes a backside portion that extends from the second surface of the substrate to a bottom of a deepest stress-decoupling trench, wherein the backside portion extends laterally throughout a body of the substrate such that the substrate is of a one-piece integral construction.

6. The semiconductor device of claim 5, wherein the first spring structure extends from the backside portion of the substrate towards the first surface of the substrate to form a sidewall of each of the first pair of adjacent stress-decoupling trenches.

7. The semiconductor device of claim 5, wherein the second surface of the substrate is free from backside trenches and cavities.

8. The semiconductor device of claim 5, wherein the semiconductor chip includes a plurality of spring structures, including the first spring structure, arranged between the plurality of stress-sensitive areas, and the plurality of spring structures are conjoined by the backside portion of the substrate.

9. The semiconductor chip of claim 1, wherein:
the substrate includes a first conductive structure arranged in the first region, a second conductive structure arranged in the second region, and a third conductive structure arranged in the first spring structure, and the third conductive structure is electrically connected to and between the first conductive structure and the second conductive structure.

10. The semiconductor chip of claim 1, wherein:
the at least one stress-decoupling trench includes a second pair of adjacent stress-decoupling trenches arranged laterally from a second lateral side of the stress-sensitive sensor,
the semiconductor chip further comprises a second spring structure formed between the second pair of adjacent stress-decoupling trenches such that the second spring structure is arranged laterally from the stress-sensitive sensor and is configured to absorb external stress from the environment, and
the BEOL stack is disposed on the second spring structure.

11. The semiconductor chip of claim 10, wherein the BEOL stack includes a first portion arranged in the first region and which includes a first conductive structure, a second portion arranged in the second region and which includes a second conductive structure, and a third portion arranged on the second spring structure and which includes a third conductive structure that is electrically connected to and between the first conductive structure and the second conductive structure.

12. The semiconductor chip of claim 10, wherein:
the BEOL stack includes a first portion arranged in the first region and which includes a first conductive structure, a second portion arranged in the second region and which includes a second conductive structure, a third portion arranged on the first spring structure and which includes a third conductive structure that is electrically connected to and between the first conductive structure and the second conductive structure, and
the BEOL stack includes a fourth portion arranged in the first region and which includes a fourth conductive structure, a fifth portion arranged in the second region and which includes a fifth conductive structure, a sixth portion arranged on the second spring structure and which includes a sixth conductive structure that is electrically connected to and between the fourth conductive structure and the fifth conductive structure.

13. The semiconductor chip of claim 10, wherein:
the substrate includes a first conductive structure arranged in the first region, a second conductive structure arranged in the second region, and a third conductive structure arranged in the second spring structure, and
the third conductive structure is electrically connected to and between the first conductive structure and the second conductive structure.

14. The semiconductor chip of claim 10, wherein:
the substrate includes a first conductive structure arranged in the first region, a second conductive structure arranged in the second region, a third conductive structure arranged in the first spring structure, wherein the third conductive structure is electrically connected to and between the first conductive structure and the second conductive structure, and
the substrate includes a fourth conductive structure arranged in the first region, a fifth conductive structure arranged in the second region, a sixth conductive structure arranged in the second spring structure, wherein the sixth conductive structure is electrically connected to and between the fourth conductive structure and the fifth conductive structure.

15. A semiconductor chip, comprising:
a first region;
a second region that is peripheral to the first region;
a substrate having a first surface and a second surface arranged opposite to the first surface;
a stress-sensitive sensor disposed in the first region at the first surface of the substrate, wherein the stress-sensitive sensor includes a sensitive area that is sensitive to mechanical stress;
a back end of line (BEOL) stack disposed on the first surface of the semiconductor chip that extends laterally from the MEMS element, in the first region of the semiconductor chip, into the second region of the semiconductor chip;
a first cavity formed in the BEOL stack that exposes the sensitive area of the stress-sensitive sensor, wherein the first cavity extends entirely through the BEOL stack over the first region thereby exposing the sensitive area of the stress-sensitive sensor; and
at least one stress-decoupling trench laterally spaced from the stress-sensitive sensor and laterally spaced from the first cavity with a portion of the BEOL stack interposed between the at least one stress-decoupling trench and the first cavity, wherein the at least one stress-decoupling trench extends through the BEOL stack and through the first surface into the substrate, wherein the at least one stress-decoupling trench extends partially into the substrate towards the second surface although not completely to the second surface, and wherein the at least one stress-decoupling trench defines a vertical boundary between the first region of the semiconductor chip and the second region of the semiconductor chip,
wherein the at least one stress-decoupling trench includes a first pair of adjacent stress-decoupling trenches arranged laterally from a first lateral side of the stress-sensitive sensor,
wherein the semiconductor chip further comprises a first spring structure formed between the first pair of adjacent stress-decoupling trenches such that the first spring structure is arranged laterally from the stress-sensitive sensor and is configured to absorb external stress from an environment,
wherein the substrate includes at least one first conductive structure arranged in the first region, at least one second conductive structure arranged in the second region, and at least one third conductive structure arranged in the first spring structure, and
wherein the at least one third conductive structure is electrically connected to and between the at least one first conductive structure and the at least one second conductive structure.

16. The semiconductor chip of claim 15, wherein the at least one first conductive structure is electrically coupled to the stress-sensitive sensor and the at least one second conductive structure is electrically coupled to a sensor circuit integrated in the substrate in the second region of the semiconductor chip.

17. The semiconductor chip of claim 15, wherein the at least one first conductive structure, the at least one second conductive structure, and the at least one third conductive structure are implant regions that are implanted in the substrate.

* * * * *